United States Patent
Zhao et al.

(10) Patent No.: US 7,602,056 B2
(45) Date of Patent: Oct. 13, 2009

(54) ON-DIE TERMINATION METHOD FOR MULTI-CHIP PACKAGES

(75) Inventors: Richard Zhao, Portland, OR (US); Chris Mozak, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 240 days.

(21) Appl. No.: 11/453,786

(22) Filed: Jun. 14, 2006

(65) Prior Publication Data

US 2007/0290323 A1  Dec. 20, 2007

(51) Int. Cl.
*H01L 23/02* (2006.01)
*H01L 23/48* (2006.01)
*H01L 23/52* (2006.01)
*H01L 29/40* (2006.01)

(52) U.S. Cl. .................. 257/678; 257/691; 257/737
(58) Field of Classification Search ......... 257/666–678, 257/665–670, 723–739, 777–786, E23.001
See application file for complete search history.

(56) References Cited

U.S. PATENT DOCUMENTS

| | | | | |
|---|---|---|---|---|
| 5,815,427 A | * | 9/1998 | Cloud et al. | 365/51 |
| 2006/0151866 A1 | * | 7/2006 | Lee | 257/686 |
| 2007/0257340 A1 | * | 11/2007 | Briggs et al. | 257/666 |

* cited by examiner

*Primary Examiner*—Cuong Q Nguyen

(57) ABSTRACT

An on-die termination method to support a multi-chip package routing topology is described. The on die termination method may increase the surface area on the substrate such that larger size die or more memory may be mounted thereto. The on-die termination method may include a semiconductor package that features on die termination bumps coupled to a semiconductor die's bus terminals, which couples the semiconductor die to an on-die termination pin coupled in the motherboard. An alternative on-die termination method includes a semiconductor die, within the multi-chip CPU package, designated as an end agent from which a single on die termination bump is coupled to an on-die termination pin.

15 Claims, 6 Drawing Sheets

ON-DIE TERMINATION METHOD FOR MULTI-CHIP PACKAGES

FIELD

Embodiments of the invention relate generally to multi-chip packages, and, more specifically, to an on-die termination method for multi-chip packages.

BACKGROUND

Semiconductor packages have become more sophisticated over the last decade due to the trend of packaging multiple chips on a single substrate. Semiconductor packages which contain multiple chips or cores are commonly referred to as multi-chip modules (MCM); a series of MCM's are often mounted to a motherboard within a computing system. Typically, motherboards are embedded with conductive paths and traces such that the semiconductor packages can communicate with each other and with the outside world. Similarly, each semiconductor package has a conductive path which allows communication with other die within the semiconductor package.

FIG. 1 shows a prior art multi-chip package 150 featuring semiconductor package 101 mounted to a motherboard 100. Semiconductor package 101 has embedded traces 105 which enable communication between a first and second semiconductor die 102, 103. First and second semiconductor die 102, 103 have first bus terminals 107, 112 and second bus terminals 108, 113 and first and second semiconductor die 102, 103 communicate with other semiconductor die via their respective buses. First bus terminals 107, 112 and second bus terminals 108, 113 may be terminals of data and address buses, respectively.

Signal driver 110 may propagate signals to semiconductor package 101 via conductive paths, such as trace 105 and die/motherboard contact 106 to first bus terminal 107 of first semiconductor die 102. The signal continues its route from first bus terminal 107 and is further transmitted to other semiconductor die coupled to motherboard 100.

The signal bandwidth depends primarily on the processing power of the individual semiconductor die within the network of semiconductor packages. Presently, microprocessors have clocked speeds in excess of three gigahertz. Likewise, there is a need to effectively terminate these high speed signals after they have reached their final intended destination or "end agent." Without properly terminating the signals at the end agent, the transmitted signals may interfere with subsequent propagated signals; thus, creating the need for on-die termination.

FIG. 1 further illustrates an on-die termination method of the prior art, which includes an ODT pin 115 coupled to end agent, second semiconductor die 103. ODT pin 115 terminates the propagated signal at end agent, second semiconductor die 103, while the on-die termination resistors are put in HighZ by grounding the on-die termination resistor 109 of first semiconductor die 102 as illustrated in FIG. 1.

The conventional on-die termination method confines the semiconductor die within a semiconductor package to function as either a middle agent or an end agent. This constraint limits the die within the semiconductor package to one orientation scheme, which further limits the size of each die mounted to the package substrate. In the multi-chip package illustrated in FIG. 1, only 2M cache of memory can be coupled to semiconductor die 102 and semiconductor die 103 due to the limited lateral area available on the package substrate.

BRIEF DESCRIPTION OF THE DRAWINGS

Embodiments of the present invention are illustrated by way of example and not limitation in the figures of the accompanying drawings, in which like references indicate similar elements and in which.

DETAILED DESCRIPTION

An on-die termination method is described to support a multi-chip package that features semiconductor packages disposed on a motherboard. A multi-chip package routing topology that utilizes the on die termination method may conserve surface area on a package substrate, may allow larger size die to be mounted on a package substrate, or may allow more memory within the semiconductor package. For an embodiment, a semiconductor die features on-die termination bumps coupled to the die's bus terminals, which electrically link the semiconductor die to an on-die termination pin coupled to the motherboard. In other embodiments, a semiconductor die within the multi-chip CPU package designates an end agent and a single on-die termination bump couples the end agent portion of the semiconductor die to an on-die termination pin.

Figure 1:
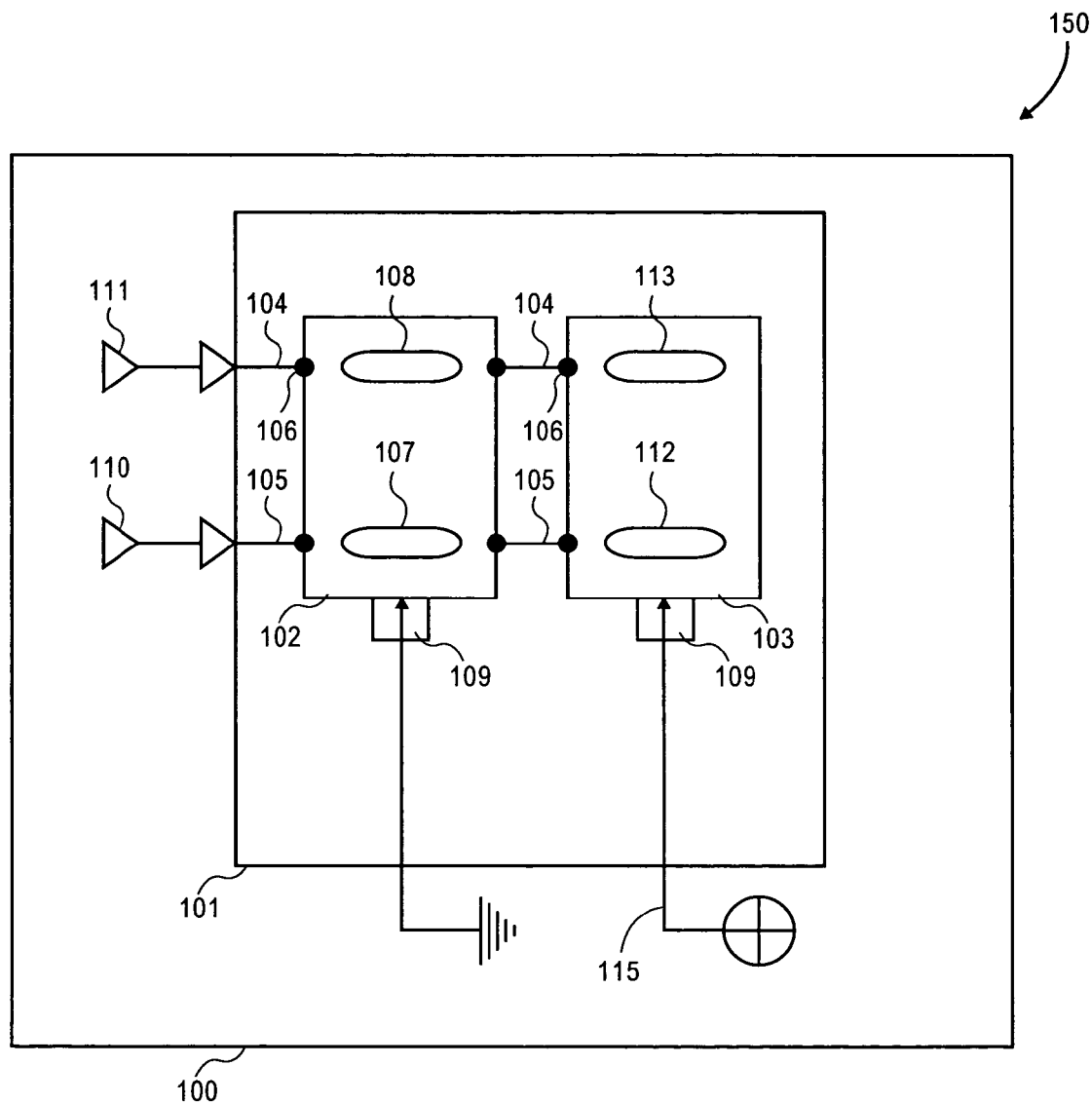
FIG. 1 shows a multi-chip CPU package of the prior art that illustrates a middle and end agent semiconductor die coupled to a motherboard.
Figure 2:
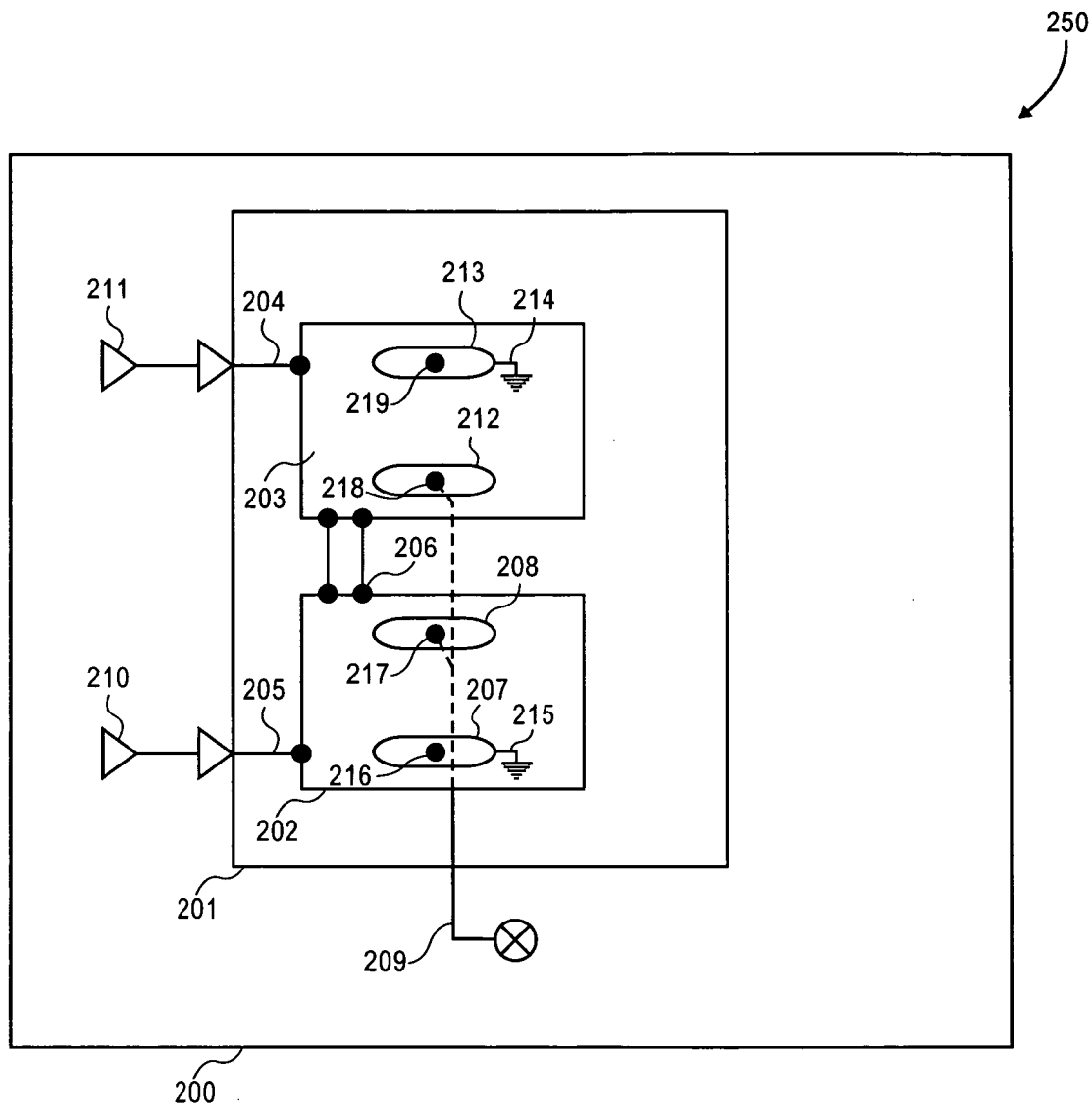
FIG. 2 shows a multi-chip CPU package that illustrates a series semiconductor dice, which feature a hybrid of middle agent and end agents, coupled to a motherboard according to an embodiment of the present invention.

FIG. 2 illustrates a multi-chip package 250 that features a semiconductor package 201 disposed on a motherboard 200. As illustrated, semiconductor package 201 features semiconductor dice 202, 203 disposed within multi-chip package 250. FIG. 2 further illustrates an on-die termination pin 209 embedded in motherboard 200 coupled to first die-first bus terminal and second die-second bus terminal on-die termination bumps 217, 218 of semiconductor dice 202, 203, respectively.

A signal may be propagated to semiconductor package 201 and eventually terminated by on-die termination pin 209. For example, drivers 210, 211 may propagate signals to semiconductor package 201 via traces 204, 205 and contacts 206. The propagated signals may also travel through multi-chip package 250 via on die and package wires not shown in FIG. 2. In an embodiment when drivers 210, 211 propagate signals to semiconductor package 201, two bus lines are formed. For example, driver 210 may propagate a signal to semiconductor die 202 which continues to travel from bus terminal 207 to bus terminal 212 of semiconductor die 203 forming a bus line between semiconductor die 202 and semiconductor die 203. Once the signal reaches semiconductor die 203, it eventually terminates at first die-first bus terminal on die termination bump 218, which is coupled to on-die termination pin 209 such that the signal does not interfere with subsequent signals propagated by driver 210.

FIG. 2 also shows the route of a signal propagated by driver 211 within multi-chip package 250. As shown, driver 211 sends a signal to semiconductor die 203 via traces 204 and contacts 206. The signal propagated by driver 211 travels to semiconductor die 202 forming a bus line from semiconductor die 203 to semiconductor die 202. Once the signal reaches semiconductor die 202 it eventually terminates at second die-second bus terminal on die termination bump 217 such that the signal does not interfere with subsequent propagated signals by driver 211.

For the embodiment shown in FIG. 2, first die-second bus terminal and second die-first bus terminal on die termination bumps 216, 219 are grounded and are not coupled to on die termination pin 209. Therefore, signals propagated to semiconductor package 201 are neither terminated by second die-first bus nor first die-second bus on die termination bumps 216, 219.

Figure 3:
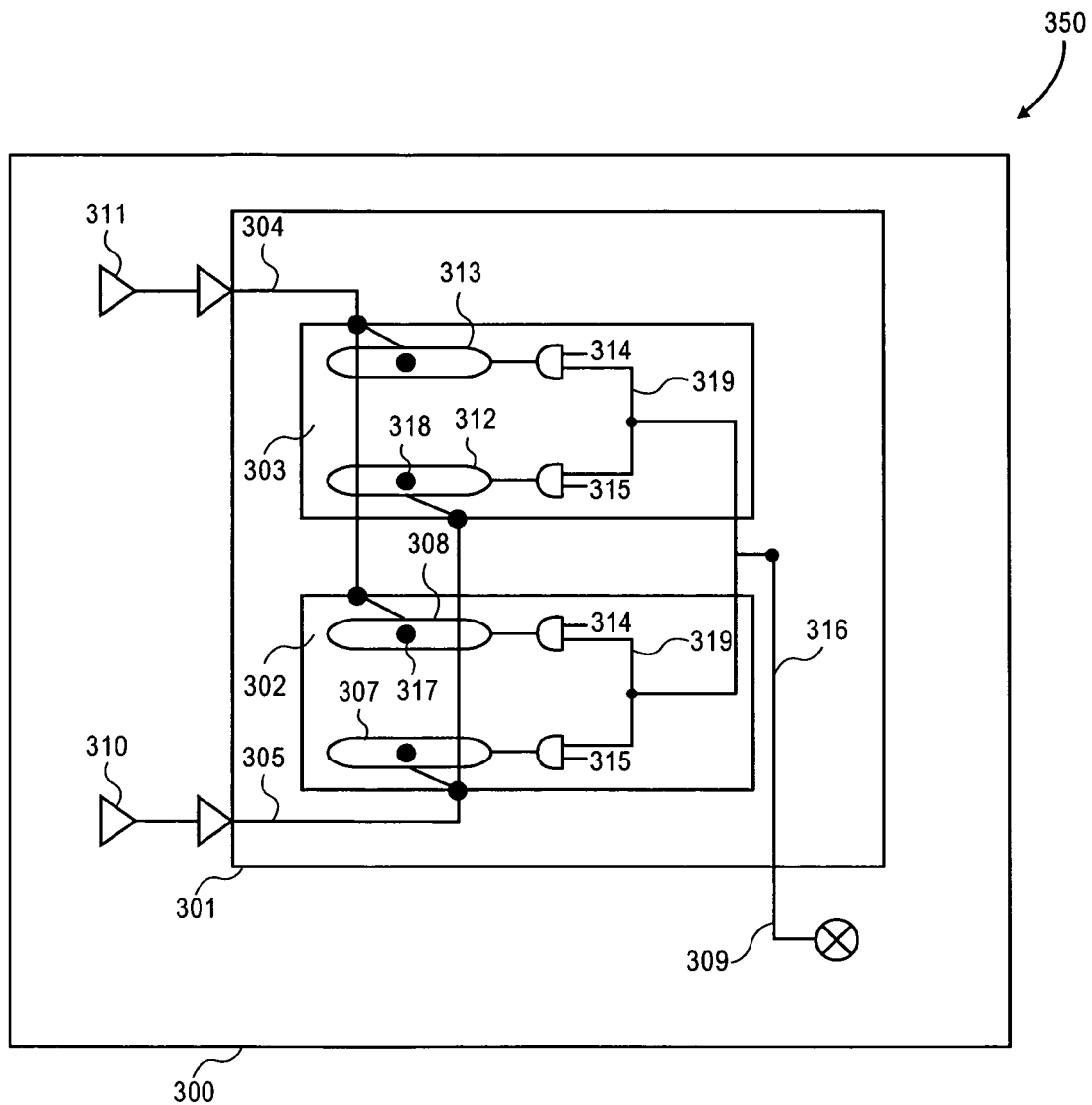
FIG. 3 shows a multi-chip CPU package that illustrates a series of semiconductor dice coupled to a motherboard that features an on die termination signal locally qualified to an end agent terminal according to an embodiment of the present invention.

FIG. 3 illustrates an alternative embodiment for terminating signals propagated in a multi-chip package 350. As illustrated, multi-chip package 350 features motherboard 300, semiconductor package 301, semiconductor dice 302, 303, drivers 310, 311, and on-die termination pin 309. FIG. 3 further illustrates traces 304, 305, on die and package wires 316, 319 contacts 306, bus terminals 307, 308, 312, 313, on-die termination bumps 317, 318 and locally qualified signals 314, 315.

For the embodiment illustrated in FIG. 3, semiconductor dice 302 and 303 are wired such that each semiconductor die can detect their physical location within multi-chip package 350. A single on-die termination bump, such as on-die termination bump 317 or on-die termination bump 318 are coupled to on-die termination pin 309 and locally qualifies an on-die termination signal. For the embodiment illustrated in FIG. 3, on-die termination signals 314, 315 are locally qualified at on-die termination bumps 317, 318 respectively. Locally qualified on-die termination signal 314, may be "Bus 2/I am Die 302" while locally qualified on-die termination signal 315 may be "Bus 1/I am Die 303." The signal could be created in multiple ways including package straps to bumps, on die fuses, or control registers.

The on-die termination methods are not limited to a single semiconductor package but are also applicable for a series of semiconductor packages mounted to a motherboard. For the embodiment of FIG. 4, a multi-chip package routing topology 450 includes a series of semiconductor packages 401, 408, and 416 mounted in series on motherboard 400. Multi-chip package routing topology 450 also features semiconductor dice 402, 403, 412, 413, 417, and 418 disposed within semiconductor packages 401, 408, and 416 respectively.

Figure 4:
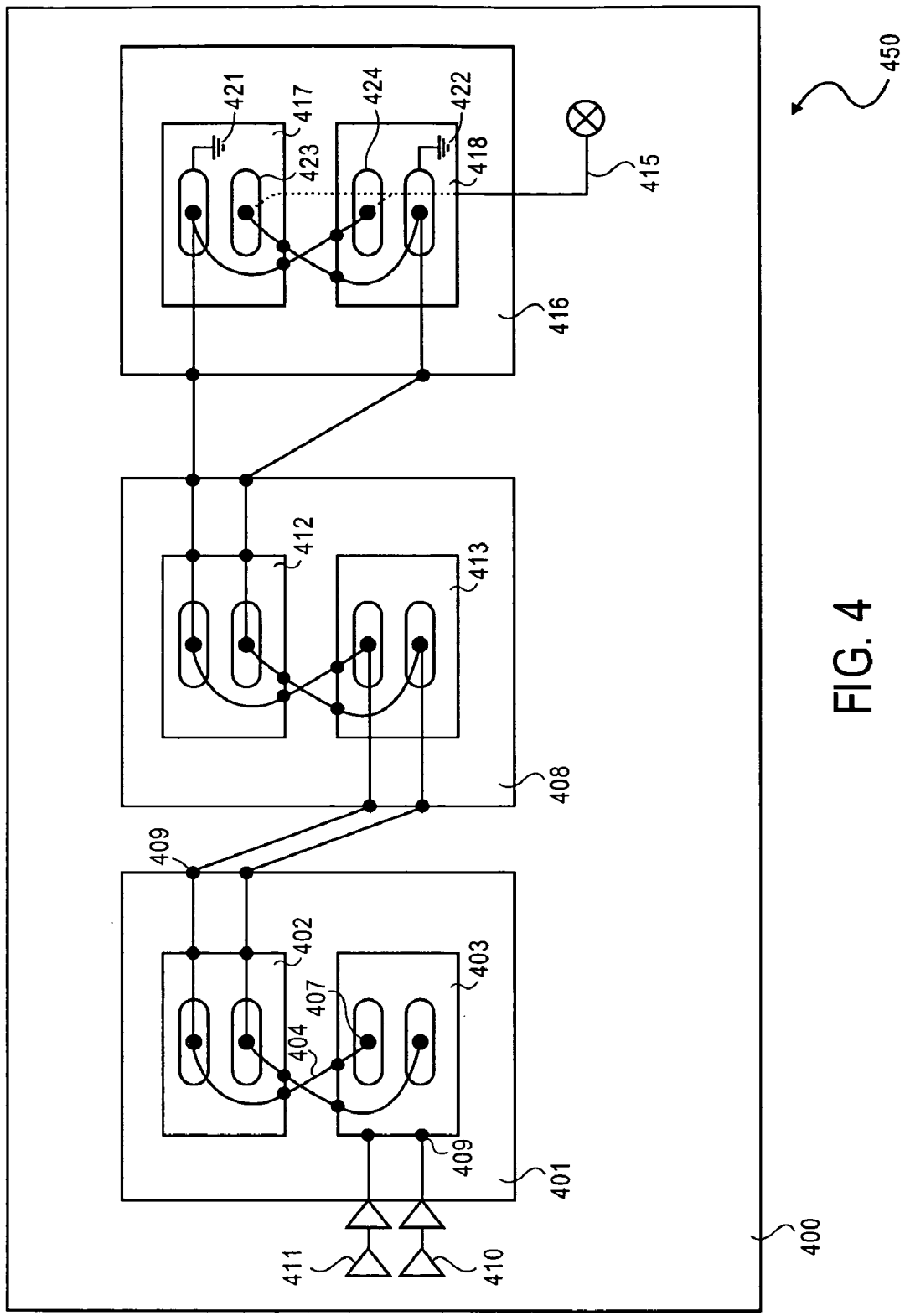
FIG. 4 shows an on-die termination method for a multi-chip package routing topology.

According to multi-chip package routing topology 450 illustrated in FIG. 4, a signal may be propagated and eventually terminated by on-die termination pin 415. For example, a signal may be propagated in multi-chip package routing topology 450 by a driver 411. The signal may travel from driver 411 to second bus terminal of semiconductor die 403 by traces embedded in semiconductor package 401. After the signal propagates through semiconductor package 401 the signal travels to semiconductor die 412, 413 of semiconductor package 408 through conductive paths 404, package wires and traces. The signal eventually reaches semiconductor package 416 of multi-chip package routing topology 450 and ultimately terminates at the second bus terminal 424 of semiconductor die 418 by on-die termination pin 415. Second bus terminal of semiconductor die 417 is grounded and the signal is not terminated by on-die termination pin 415 at this point. A signal may also propagate through each semiconductor package's first bus line and ultimately terminates at the first bus terminal 423 of semiconductor die 417 by on-die termination pin 415. Likewise, first bus terminal 422 is coupled to ground and therefore the signal is not terminated by on-die termination pin 415 at this location within the semiconductor package.

As described, the on-die termination method may be used for a series of semiconductor packages mounted to a motherboard by employing the first on-die termination method embodied in FIG. 2. Other embodiments may utilize the second on-die termination method embodied in FIG. 3 to provide on-die termination for a series of semiconductor packages.

Figure 5:
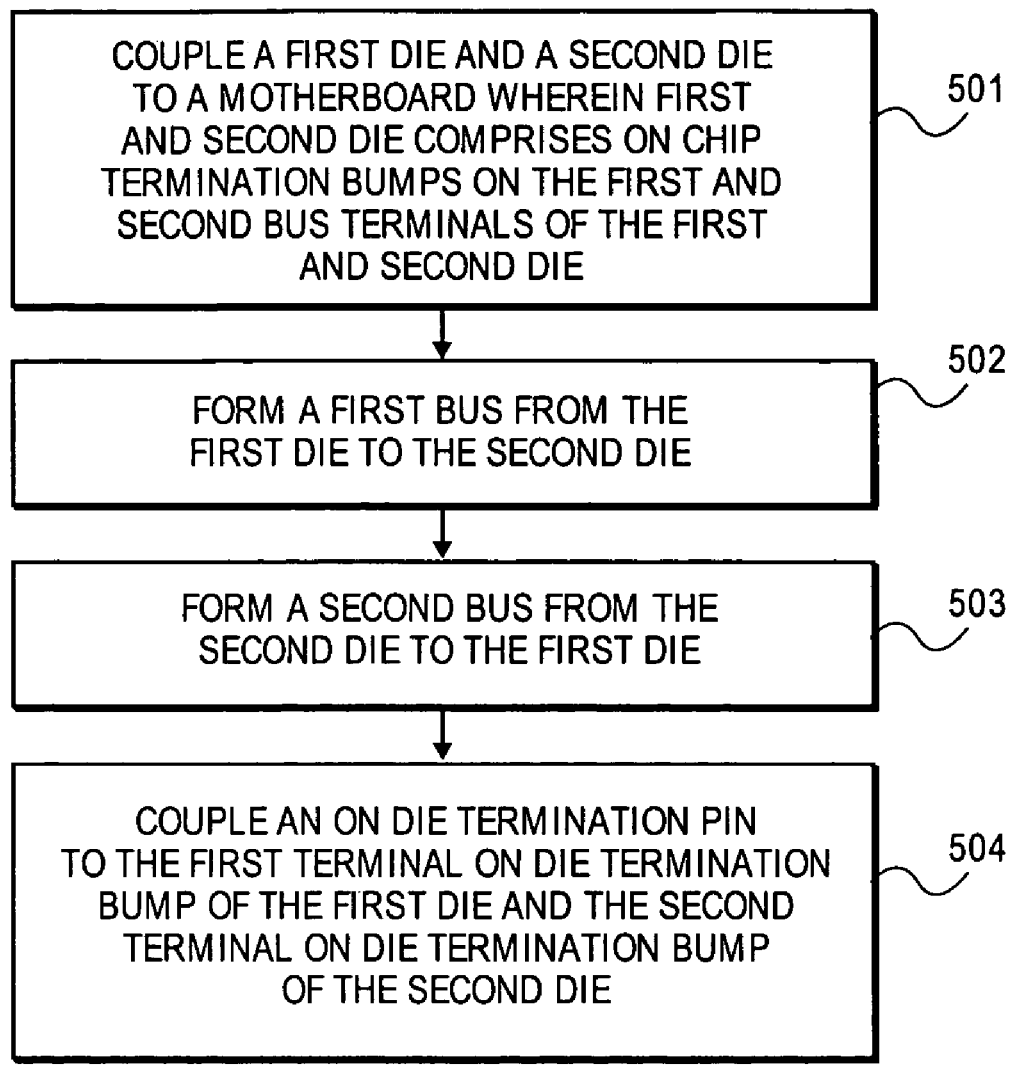
FIGS. 5-6 shows flowcharts of two methods for providing on-die termination in multi-chip CPU packages according to embodiments of the present invention.

An on-die termination method may be formed by any suitable method known in the art such that a signal propagated through a first and second bus are terminated by an on-die termination pin coupled to a first and second die mounted to a semiconductor package. For the embodiment of FIG. 5, an on-die termination method may be formed by the process recited in flowchart 500.

As recited in flowchart 500, operation 501 provides that a first die and a second die, comprising on-die termination bumps on a first and second bus terminal, are coupled to a motherboard. Next, operation 502 provides that a first bus is formed from the first die to the second die and operation 503 provides that a second bus is formed from the second die to the first die. Then, according to operation 504, an on-die termination pin is coupled to the first terminal on-die termination bump of the first die and the second terminal on-die termination bump of the second die.

Figure 6:
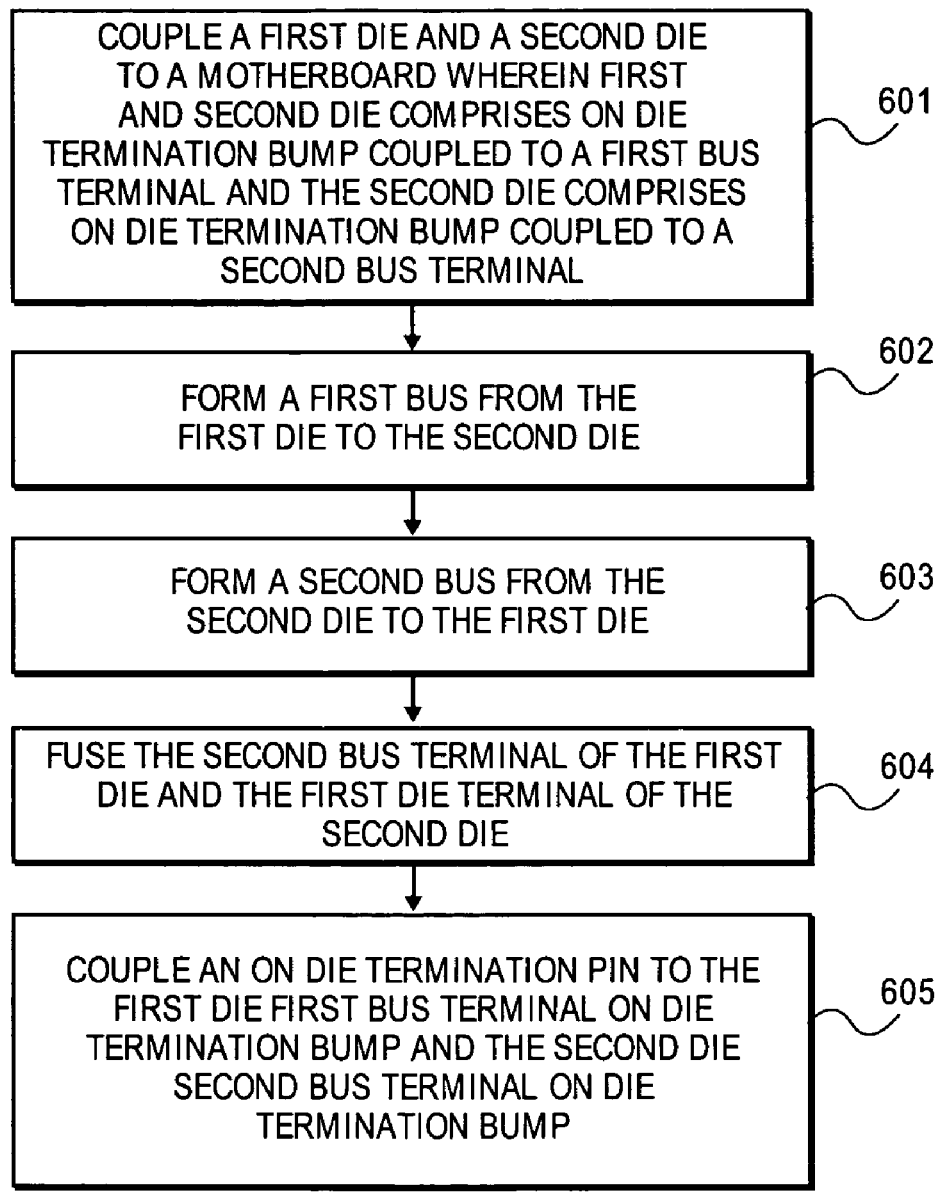

An on-die termination method may also be formed by a process recited in flowchart 600 of FIG. 6. First, according to operation 601, a first die is coupled to a motherboard. A first die comprising an on-die termination bump coupled to a first bus terminal and a second die comprising an on-die termination bump coupled to a second bus terminal are coupled to a motherboard. Next, as recited in operation 602, a first bus is formed from the first die to the second die and then according to operation 603 a second bus is formed from the second die to the first die. Next, as recited in operation 604, a second bus terminal of the first die and the first die terminal of the second die are fused such that an on-die termination signal is locally qualified at select bus terminals in the semiconductor package. An on-die termination signal may be qualified by other means such as, but not limited to, package straps to bumps or control registers. Finally, an on-die termination pin is coupled to the first die-first bus terminal on-die termination bump and the second die second bus terminal on-die termination bump, as recited in operation 605.

Embodiments may allow greater size semiconductor die to be mounted on a semiconductor package due to the mounting configurations of the semiconductor die which takes advantage of the vertical area of the respective semiconductor package. Therefore, the mounting configurations of the semiconductor die are not limited to the lateral area of the semiconductor packages. For example, each semiconductor die may accompany up to 4M of cache mounted to each respective semiconductor package. For an embodiment, two 2×4M semiconductor die are mounted to a semiconductor package within a multi-chip package.

In the foregoing specification, specific exemplary embodiments of the invention have been described. It will, however, be evident that various modifications and changes may be made thereto. The specification and drawings are, accordingly, to be regarded in an illustrative rather than a restrictive sense.

What is claimed is:

1. A semiconductor package comprising:
    a first die wherein said first die includes a first bus terminal, a second bus terminal, a first die-first bus terminal on die termination bump, and a first die-second bus terminal on die termination bump;
    a second die proximate to said first die, wherein said second die includes a first bus terminal, a second bus terminal, a second die-first bus terminal on die termination bump, and a second die-second bus terminal on die termination bump; and
    an on-die termination pin coupled to said first die-first bus terminal on die termination bump and said second die-second bus terminal on die termination bump.

2. The semiconductor package of claim 1 wherein said first die-first bus terminal and said second die-first bus terminal forms a first bus and wherein said first bus-second bus terminal and said second die-second bus terminal forms a second bus.

3. The semiconductor package of claim 1, wherein said first bus is an address line and said second bus is a data line.

4. The semiconductor package of claim 1 further comprises traces, conductive paths, and contacts.

5. The semiconductor package of claim 1, wherein said first die and said second die are mounted to a substrate.

6. The semiconductor package of claim 1, wherein said first die-second bus terminal on die termination bump and said second die-first bus terminal on die termination bump are coupled to ground.

7. The semiconductor package of claim 1, wherein said first die-first bus terminal and said second die-second bus terminal are end agents.

8. The semiconductor package of claim 1, wherein said first die-second bus terminal and said second die-first bus terminal are middle agents.

9. The semiconductor package of claim 2, wherein said first bus is controlled by a first signal and said second bus is controlled by a second signal.

10. The semiconductor package of claim 9, wherein said first signal and said second signal are not the same.

11. A semiconductor package comprising:
    a first die, wherein said first die includes a first bus terminal, a tapped second bus terminal, and a first die-first bus terminal on die termination bump;
    a second die proximate to said first die, wherein said second die includes a tapped first bus terminal, a second bus terminal, and a second die-second bus terminal on die termination bump;
    an on die termination pin coupled to said first die-first bus terminal on die termination bump and said second die-second bus terminal on die termination bump.

12. The semiconductor package of claim 11, wherein a first signal is locally qualified by said first die-first bus terminal on die termination bump and a second signal is locally qualified by said second die-second bus terminal on die termination bump.

13. The semiconductor package of claim 12, wherein said first signal is Bus 1/I am First Die.

14. The semiconductor package of claim 12, wherein said second signal is Bus 2/I am Second Die.

15. The semiconductor package of claim 12, wherein said first signal and said second signal is locally qualified by a method selected from the group consisting of package straps to bumps, on die fuses, and control registers.

* * * * *

UNITED STATES PATENT AND TRADEMARK OFFICE
CERTIFICATE OF CORRECTION

PATENT NO.      : 7,602,056 B2                                            Page 1 of 1
APPLICATION NO. : 11/453786
DATED           : October 13, 2009
INVENTOR(S)     : Zhao et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 361 days.

Signed and Sealed this

Fifth Day of October, 2010

David J. Kappos
*Director of the United States Patent and Trademark Office*